United States Patent [19]
Hawkins et al.

[11] Patent Number: 5,969,392
[45] Date of Patent: Oct. 19, 1999

[54] THERMAL INK JET PRINTHEADS WITH POWER MOS DRIVER DEVICES HAVING ENHANCED TRANSCONDUCTANCE

[75] Inventors: William G. Hawkins, Webster; Cathie J. Burke, Rochester, both of N.Y.

[73] Assignee: Xerox Corporation, Stamford, Conn.

[21] Appl. No.: 08/344,397

[22] Filed: Nov. 23, 1994

Related U.S. Application Data

[63] Continuation of application No. 07/971,873, Nov. 5, 1992, abandoned.

[51] Int. Cl.$^6$ ............ H01L 29/76; H01L 29/94; H01L 31/062; H01L 31/113; H01L 31/119
[52] U.S. Cl. ............ 257/380; 257/379; 257/408; 257/409; 257/536
[58] Field of Search .................. 257/408, 409, 257/379, 380, 536

[56] References Cited

U.S. PATENT DOCUMENTS

| | | | |
|---|---|---|---|
| 4,599,576 | 7/1986 | Yoshida | 257/408 |
| 4,947,192 | 8/1990 | Hawkins et al. | 346/140 R |
| 5,010,355 | 4/1991 | Hawkins et al. | 346/140 R |
| 5,075,250 | 12/1991 | Hawkins et al. | 437/52 |
| 5,089,871 | 2/1992 | Fujihara | 257/408 |

FOREIGN PATENT DOCUMENTS 2-87675  3/1990  Japan ................ 257/409

OTHER PUBLICATIONS

"Integrated High–Voltage/Low–Voltage MOS Devices"; IEDM; 1981; p. 259.
"850V NMOS Driver with Active Outputs"; IEDM; 1984; p. 266.

*Primary Examiner*—Mahshid Saadat
*Assistant Examiner*—Allan R. Wilson
*Attorney, Agent, or Firm*—William A. Henry, II

[57] ABSTRACT

A high voltage MOS transistor, for use in a thermal ink jet printhead, is fabricated with a single, uniformly thick layer of polysilicon that serves as a field plate over the drift region and a gate over the channel region. The fabrication of the drift region and associated drift oxide is performed in a sequence independent of the device channel stop and field oxide fabrication, allowing the drift region to be optimized by varying the thickness of the drift oxide. Using a field plate to increase the breakdown voltage of the device by reducing the concentration of the electric field, the device transconductance is increased by increasing the doping of the drift region without an attendant decrease in breakdown voltage.

8 Claims, 9 Drawing Sheets

THERMAL INK JET PRINTHEADS WITH POWER MOS DRIVER DEVICES HAVING ENHANCED TRANSCONDUCTANCE

This is a continuation of application Ser. No. 07/971,873 filed Nov. 5, 1992, now abandoned.

BACKGROUND OF THE INVENTION

1. Field of the Invention

This invention relates to improved integrated circuit devices a more particularly, to an improved integrated circuit device for use in a thermal ink jet printhead which contains active logic and driver devices, along with passive resistive heater elements and a method for making the integrated circuit device.

2. Description of the Prior Art

Drop-on-demand thermal ink jet printers are generally well known, and in such systems, a thermal ink jet printhead comprises one or more ink filled chambers communicating with an ink supply chamber and an array of orifices, generally referred to as nozzles. A plurality of thermal transducers, usually resistors, are located in the channels at a predetermined location relative to the nozzles. The resistors are individually addressed with a current pulse to momentarily vaporize the ink in contact therewith and form a bubble which expels an ink droplet. As the bubble grows, the ink bulges from the nozzle and is contained by the surface of the ink as a meniscus. As the bubble begins to collapse, the ink between the nozzle and the bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity required for the droplet to proceed in a substantially straight line direction towards a recording medium, such as paper.

A typical thermal ink jet printhead for use in an ink jet printer comprises an ink flow directing component, such as an etched silicon substrate which contains a linear array of channels open at one end and a common reservoir in communication with the channels, and a logic and thermal transducer component, such as a substrate which contains a linear array of heating elements, usually resistors, and monolithically integrated logic drivers. The components are aligned and mated with one resistor in each channel a predetermined distance from the channel open end; the channel open ends serving as the droplet expelling nozzles. Power MOS drivers immediately next to and integrated on the same substrate as the array of resistors are driven by logic elements, also integrated on the same substrate, that selectively enable the drivers which apply electrical pulses to the resistors. One known method of fabricating thermal ink jet printheads is to form a plurality of the ink flow directing components and a plurality of logic, driver, and thermal transducer components on respective silicon wafers, and then aligning and bonding the wafers together, followed by a process for separating the wafers into a plurality of individual printheads, such as by dicing. The number of sets of logic, driver, and thermal transducer components which may be formed on a wafer establishes the number of printheads that can be obtained from a wafer pair. Therefore, reduction in any portion of the logic, driver, and thermal transducer component will shrink the size of the printhead, increasing the number per wafer and, consequently, increasing the printhead yield per wafer pair, with the result of lowering manufacturing costs.

Combining driver and transducer elements on a single chip using standard NMOS process steps is exemplified by U.S. Pat. No. 4,947,192 to Hawkins et al., which discloses a monolithic silicon integrated circuit for a thermal ink jet printer wherein a MOS transistor and resistor are formed on the same substrate. The reference indicates the potential for adding logic circuitry capable of addressing an arbitrarily large number of ink jets with minimal electrical connections. Such a monolithic device, having logic elements, drivers, and transducers incorporated therein, would generally require added photoresist masking and implant steps to produce enhancement and depletion mode logic devices. A device of this type is achieved using a single polysilicon layer. Specifically, the source-drain n-type contacts are doped with arsenic, while polysilicon is doped with phosphorous to create a low resistivity (25 $\Omega/\square$) material at the ends of the transducers. The method constitutes an eleven mask step process to create the structure.

Power MOS devices are suited for the thermal ink jet power applications, because of superior switching speeds and higher voltage breakdown characteristics. However, a power MOS device is limited by its sensitivity to mobile ions such as $Na^+$, $Li^+$, and $K^+$, commonly found in inks used by thermal ink jet printers. The sensitivity of MOS devices to ions is due to the mobility of these ions in $SiO_2$ as charged species that drift in the presence of an applied electric field, such as those created by a biased gate or metallization layer. These drifting ions in MOS devices cause unstable logic operation as evidenced in shifting threshold voltages and premature breakdown of high voltage devices. Since the inks used for thermal ink jet printing have mobile ions as part of their dye species and because mobile ion drift is accelerated by the high operational temperatures of the printhead, electronic circuitry resident in the printhead must be protected from the ink.

U.S. Pat. No. 5,010,355 to Hawkins et al. discloses an improved ink jet printhead having ionic passivation of integrated MOS circuitry which is exposed to ink. The improvement is obtained through the deposition of a multi-layered, thin film insulated coating consisting of a first layer of doped or undoped silicon dioxide having a thickness of 200 angstroms to 2 microns followed by a second layer of plasma nitride having a thickness of 1000 angstroms to 3 microns. The silicon nitride is etched from the protective layers, usually Ta, over the resistor elements and electrical contact pads for external connection to electrical power, so that the first layer of silicon oxide is exposed, followed by etching of the silicon oxide to remove it also from the protective layers and contact pads. Thus, the MOS circuitry is protected from mobile ions in the ink by the multi-layered coating, while substantially the same fabrication process of a printhead is maintained. In an alternative embodiment, the multi-layered ionic passivation comprises three thin film layers with a final polyimide layer interfacing with ink.

Further improvements to device fabrication techniques are exemplified by U.S. Pat. No. 5,075,250 to Hawkins et al. which discloses an improved NMOS fabrication technique that is more cost effective and provides more reliable and compact elements. The fabrication technique has high yields and enables monolithic integration of logic drivers and transducer elements. The improvement is related to methods by which mask and implant steps can be combined to reduce the number of critical processing steps. Specifically, it is directed at replacing separate arsenic source-drain and phosphorous polysilicon masking and implant steps with a single phosphorous masked implant step. It further eliminates a second mask level by self-aligning the boron substrate contact to the etched vias in the reflow glass layer.

Improved thermal ink jet fabrication techniques with a reduced process sequence have enabled a high yield production of monolithic integrated logic, driver and transducer elements. However there continues to exist a need for an improved fabrication sequence that allows substantial shrinkage of the thermal ink jet die. For example, by increasing the transconductance of devices without decreasing the breakdown voltage, the size of the drivers may be reduced so that the number of die per wafer increases, which correspondingly decreases printhead cost. Since power MOS drivers account for approximately 40% of thermal ink jet die area, significant die savings can be achieved by increasing the efficiency of the driver element. Tradeoffs, however, are made when fabricating power (high voltage) MOS devices with comparable or increased transconductance and decreased size. Generally, as the transconductance of a power MOS device is increased with heavier drift region doping, the breakdown voltage decreases. Two arrangements of lateral power MOS drivers are offset gate and field plated power MOS drivers, both of which are exemplified in the above-mentioned U.S. Pat. No. 4,947,192 to Hawkins et al. Emphasis has been placed on producing offset gate power MOS drivers since they require fewer process steps to fabricate and typically consume less space, making them more readily implemented under the design constraints faced by thermal ink jet printheads.

Although current field plated power MOS drivers consume greater chip surface area than comparable offset gate power MOS drivers, field plated power MOS drivers have attractive performance attributes which can lead to further shrinkage of thermal ink jet dies. In operation, when a potential is applied across the drain and source of a field plated driver, the drift layer is pinched or depleted of carriers between the grounded wafer and the grounded field plate. Field strength at the drift region to channel region is greatly reduced by the field plate placed over the drift region, which thereby controls the breakdown voltage of the device while increasing its transconductance. For example, Buhler et al., "Integrated High-Voltage/Low-Voltage MOS Devices", IEDM, 1981, p. 259, discloses a high voltage device structure and a corresponding fabrication process that utilizes a highly resistive field plate to control device breakdown and transconductance. The polysilicon is differentially doped to be conductive in the contact areas to the drain and gate and is highly resistive over the drift area. Martin et al., "805V NMOS Driver with Active Outputs", IEDM, 1984, p. 266, further disclose an improved high voltage device by adding an additional layer of polysilicon and lightly doping the silicon underneath the field plate (drift layer). One layer of the field plate has a high sheet resistance to set the surface potential of the drift region. In both devices, the field plate is over a thick field oxide layer. Although the improvements brought forth by Buhler and Martin provide high voltage field plated power MOS devices, they do not meet thermal ink jet MOS driver size or current handling requirements. In addition, their fabrication process to define the drift layer does not enable rework of the photolithography. Thus, although improvements have been made, there continues to exist a need to reduce the size of high voltage field plated devices, while providing a transconductance comparable to current offset gate devices with no attendant loss in breakdown voltage.

SUMMARY OF THE INVENTION

It is, therefore, an object of the present invention to provide an improved field plated power MOS driver transistor having reduced size and enhanced transconductance without sacrificing driver breakdown voltage.

It is another object of the invention to incorporate the improved field plated power MOS driver into a thermal ink jet print head to substantially shrink the thermal ink jet heater die, thereby increasing the number of die per wafer with attendant reduction in printhead fabrication cost.

It is yet another object of the invention to provide a fabrication sequence for monolithic thermal ink jet printhead fabrication, incorporating the improved field plated power MOS driver.

The present invention is therefore directed to an improved MOS device for use in a thermal ink jet printing system, having at least driver and transducer elements formed monolithically on a silicon substrate. The invention is further directed towards a fabrication sequence incorporating a minimal number of process steps to produce the aforementioned monolithic device. By using a field plated power MOS structure that achieves lower electric fields with comparable transconductance, the doping in the drift layer of the device can be increased, thereby increasing driver transconductance. Therefore, increased driver transconductance provides a means to significantly shrink the integrated circuit chip, since a significant portion of the chip depth is consumed by the power MOS driver. Consequently, as a result of shrinking the integrated circuit chip, the number of ink jet print heads per wafer is increased, which decreases chip unit cost.

The present invention improves the device by forming a drift layer under a drift oxide which is independent of the device channel stop and field oxide. Consequently, forming the drift oxide independent of the field oxide and before the gate oxide, enables a single layer of polysilicon to be used as both a gate over the channel region and a field plate over the drift region. Since the thickness of the oxide over the drift region is independent from the field oxide, the drift region can be optimized. One optimization is realized by using a thinner drift oxide, to allow the field plate to depete a more highly doped drift region. A less resistive drift layer can be pinched or depleted of carriers to increase driver transconductance without an attendant decrease in breakdown voltage. Also, since the drift oxide and field oxide are formed separately, a reduced level of oxide encroachment is realized between the lightly doped drift region and the more heavy doped drain region. The drift region doping is also established by doping the substrate, whose resistivity is around 10 Ω-cm, rather than by compensation of the channel stop doping.

In summary, the power MOS device uses a single layer of polysilicon as a field plate over the drift region and a gate over the channel region. The drift region and associated drift oxide of the device is fabricated independent of the channel stop and field oxide, allowing the drift region to be optimized by varying the thickness of the drift oxide as well as its sheet resistance (doping concentration). By using a field plate to spread the electric field lines over wider device regions, the device transconductance is increased without an attendant decrease in breakdown voltage when the doping of the drift layer is increased. Because a single layer of uniformly doped polysilicon serves as both gate and field plate, positive bias applied to the gate is also applied to the field plate, thus accumulating the drift layer and decreasing its sheet resistance, further increasing current flow between the source and drain under high gate bias.

A more complete understanding of the present invention can be obtained by considering the following detailed description in conjunction with the accompanying drawings wherein like index numerals indicate like parts.

BRIEF DESCRIPTION OF THE DRAWINGS

FIG. 5A is an enlarged, cross-sectional view of the MOS driver shown in FIG. 4 as viewed along view line 5a—5a.

DESCRIPTION OF THE PREFERRED EMBODIMENT

Figure 1:
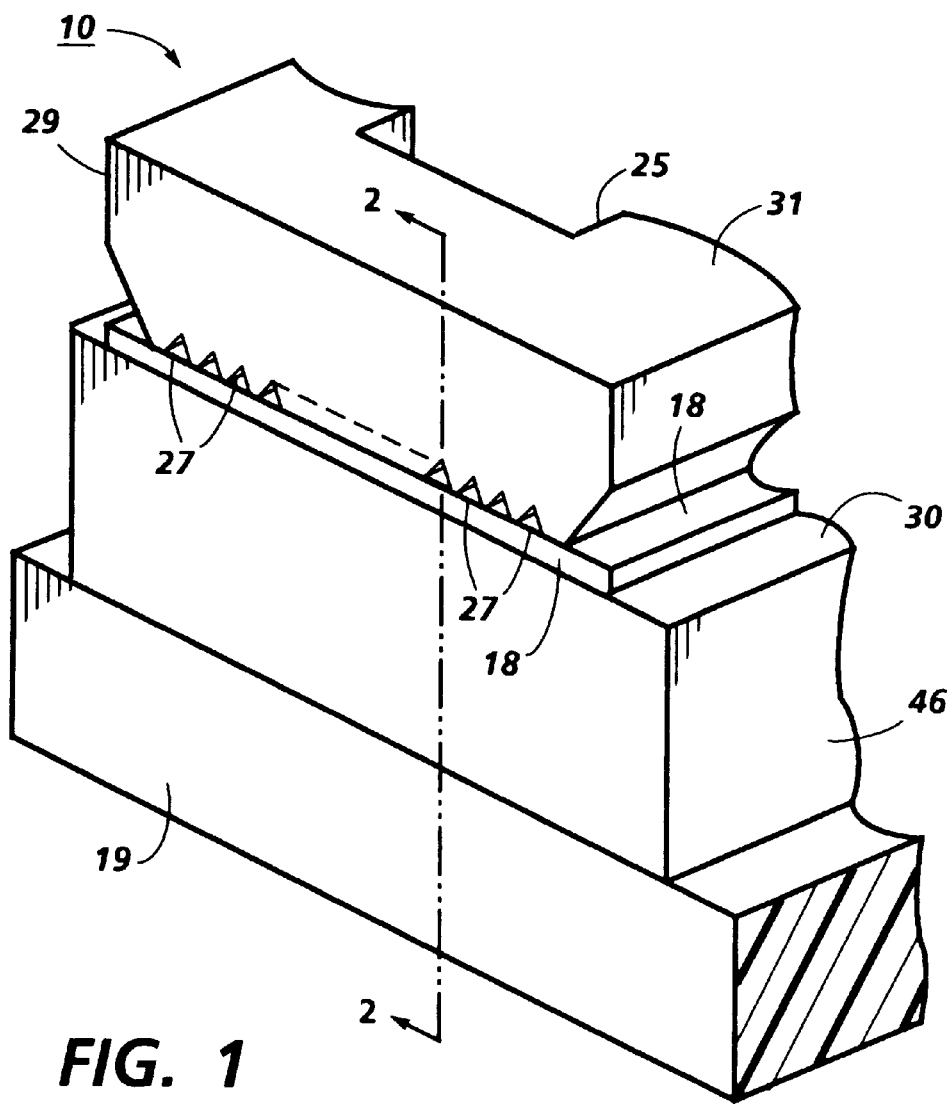
FIG. 1 is an enlarged, schematic isometric view of a thermal ink jet printhead incorporating the present invention.

An enlarged, schematic isometric view of the front face 29 of the printhead 10 showing the array of droplet emitting nozzles 27 is depicted in FIG. 1. A cross sectional view of FIG. 1 is taken along view line 2—2 through one channel and shown as FIG. 2 to show how ink flows from the manifold 24 and around the end 21 of the groove 20, as depicted by arrow 23. The lower electrically insulating substrate or heating element plate 46 which has the heating elements or resistors 44, logic circuitry 42, and MOS drivers 48 (represented schematically in cross section in FIGS. 5A and 5B) produced monolithically on surface 30 thereof, while the upper substrate or channel plate 31 has parallel grooves 20 which extend in one direction and penetrate through the upper substrate front face 29. The other end of grooves terminate at slanted wall 21. The through recess 24 is used as the ink supply manifold for the capillary filled ink channels 20 and has an open bottom 25 for use as an ink fill hole. The surface of the channel plate with the grooves are aligned and bonded to the heater plate 46, so that a respective one of the plurality of heating elements 44 is positioned in each channel, formed by the grooves and the lower substrate or heater plate. Ink enters the manifold formed by the recess 24 and the lower substrate 46 through the fill hole 25 and, by capillary action, fills the channels 20 by flowing through an elongated recess 28 formed in the optional thick film insulative layer 18 or other means of providing communication between the manifold 24 and channels 20. The ink at each nozzle forms a meniscus, the surface tension of which prevents the ink from weeping therefrom.

Figure 3:
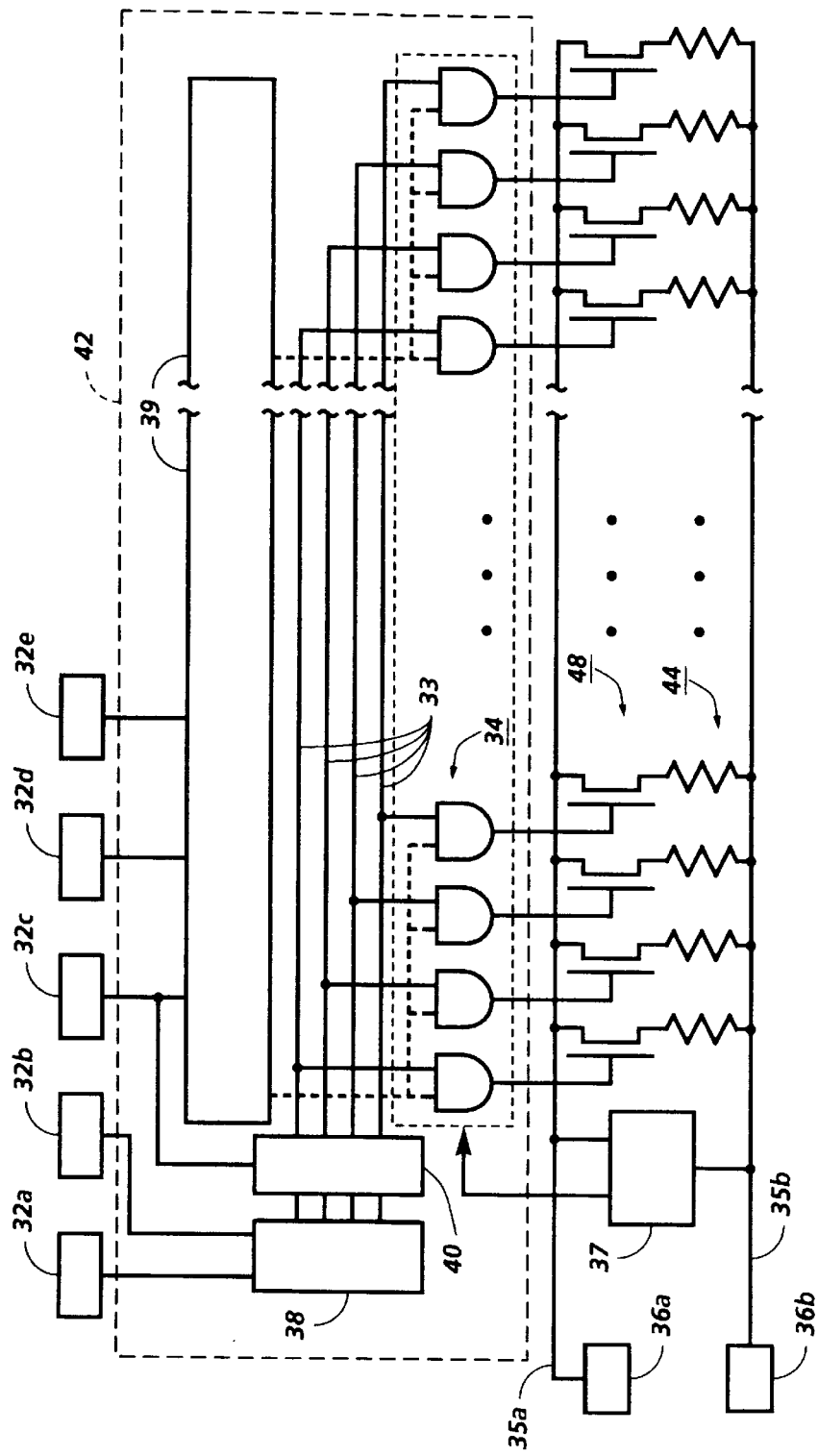
FIG. 3 is a schematic layout of the integrated circuitry of the printhead.

A typical layout of resistors (or heaters) 44, logic circuitry 42, and MOS transistor switches or drivers 48 is shown in FIG. 3. These elements are located in an area below the ink in the reservoir 24 and channels 20 of the printhead 10. The burn supply voltage of 40 volts for the resistors, applied to terminal 36b, is regulated in power supply 37 to supply voltage to the gates of drivers 48. 32 bit shift register 39 addresses sequential blocks of four resistors 44 at a time. Four data lines 33 are latched using data latch 40 and driven from a four bit shift register 38 to produce heater firing signals. A pointer bit from the 32 bit shift register and a data signal carried in each respective data line pass through NAND gates 34 and predriver circuits (not shown), and command current to pass through the corresponding heaters.

Figure 2:
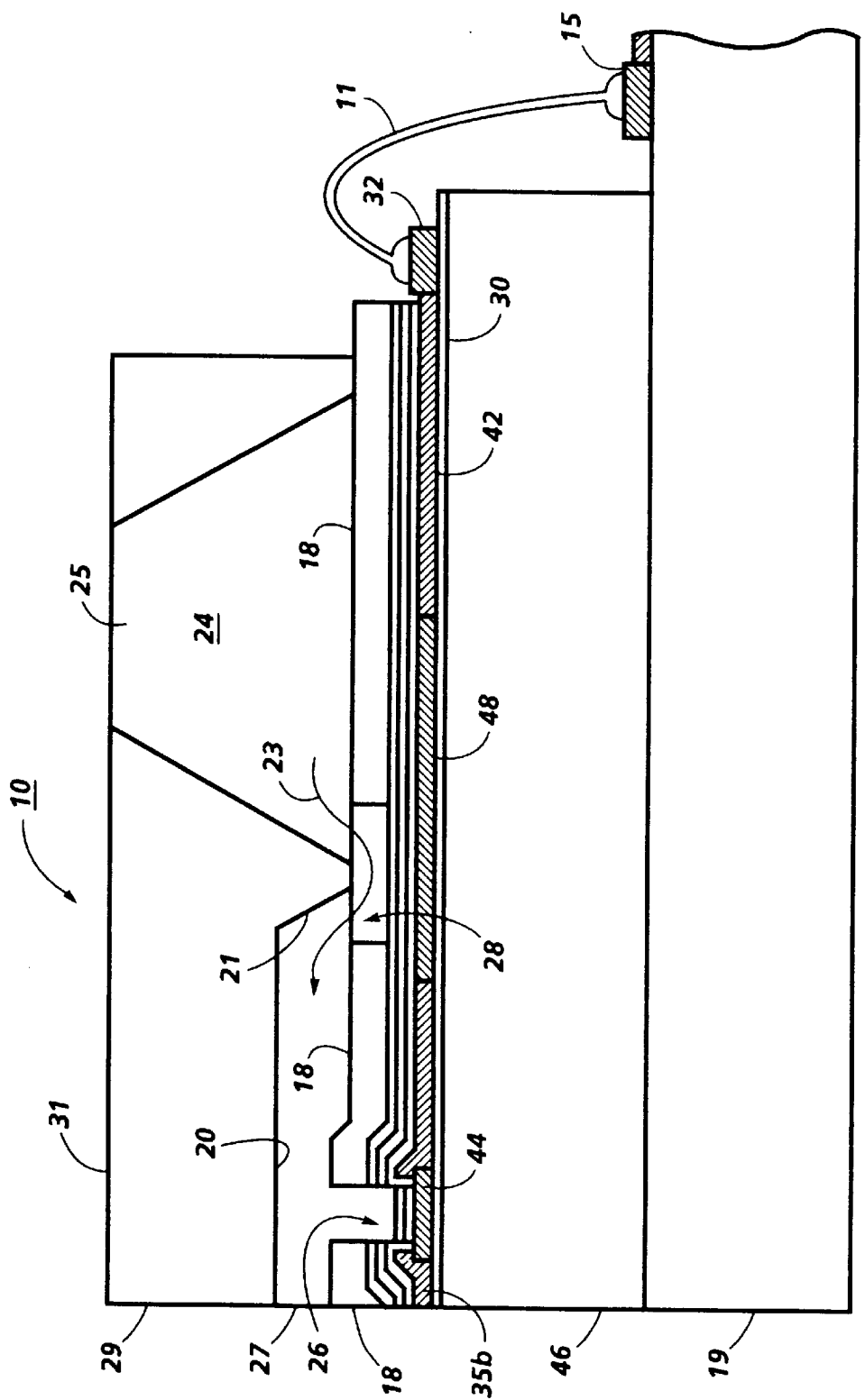
FIG. 2 is a cross-sectional view of the printhead of FIG. 1 as viewed along view line 2—2 therein, which shows an ink flow path, an ink flow channel, and the area where the printhead integrated circuitry of MOS driver, transducer and logic elements reside.

It is therefore possible to address an arbitrarily large number of heaters with seven electrical connections. In the preferred embodiment, the logic circuitry contact pads or terminals 32a–32e and terminals 36a, 36b for common returns 35a, 35b on the lower substrate or heater plate 46 provide interconnection of the MOS driver source and gate with the electrical signals from the printhead controller (not shown). Referring to FIG. 2, the upper substrate or channel plate 31 is smaller than that of the lower substrate 46 in order that the electrode terminals 32 and 36 (not shown in FIG. 2) are exposed and available for connecting the electrodes 15 on the daughter board 19, by wire bonds 11, on which the printhead 10 is permanently mounted. The daughter board electrodes are connected to the printhead controller. Optional layer 18 is a thick film passivation layer sandwiched between the upper and lower substrates. MOS fabrication techniques are used for multi-layer passivation of the logic circuitry and drivers which will also protect the circuitry from mobile ions in ink similar to methods disclosed in U.S. Pat. No. 5,010,355 to Hawkins et al., the pertinent portions of which are herein incorporated by reference. Layer 18 is etched to expose heating elements 44, thus placing them in a pit 26, and is etched to form the elongated recess 28 to enable ink flow between the manifold 24 and the ink channels 20. In addition, the thick film insulative layer is etched to expose the electrode terminals 32 and 36.

Figure 4:
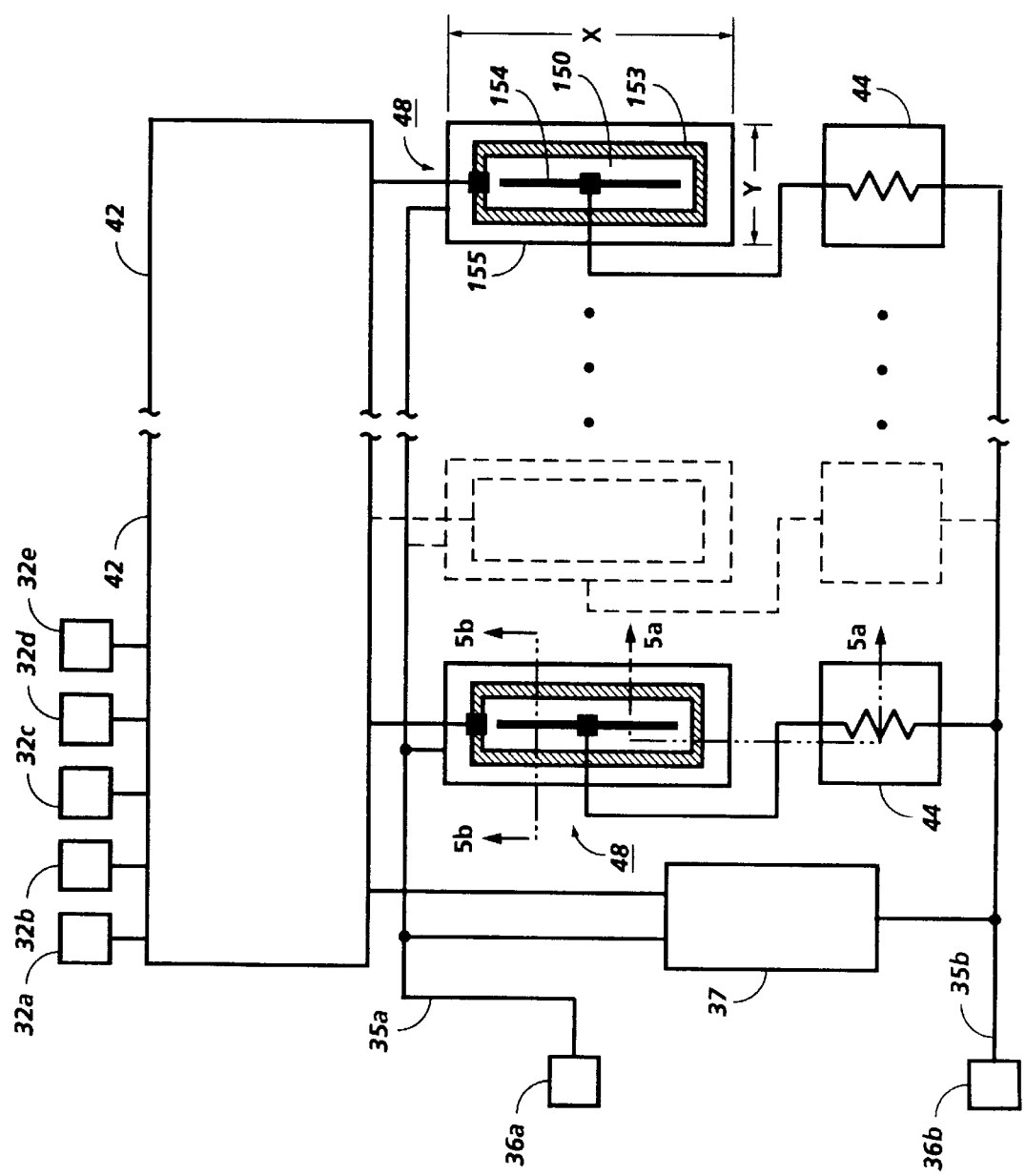
FIG. 4 is a schematic plan view of the driver and logic.
Figure 5A:
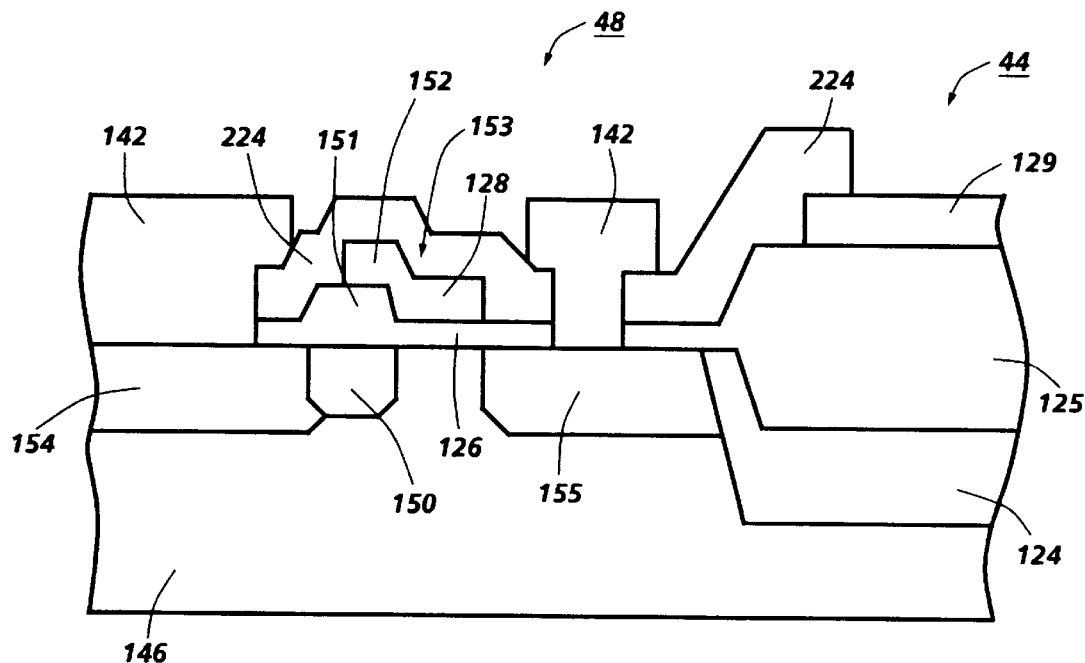
Figure 5B:
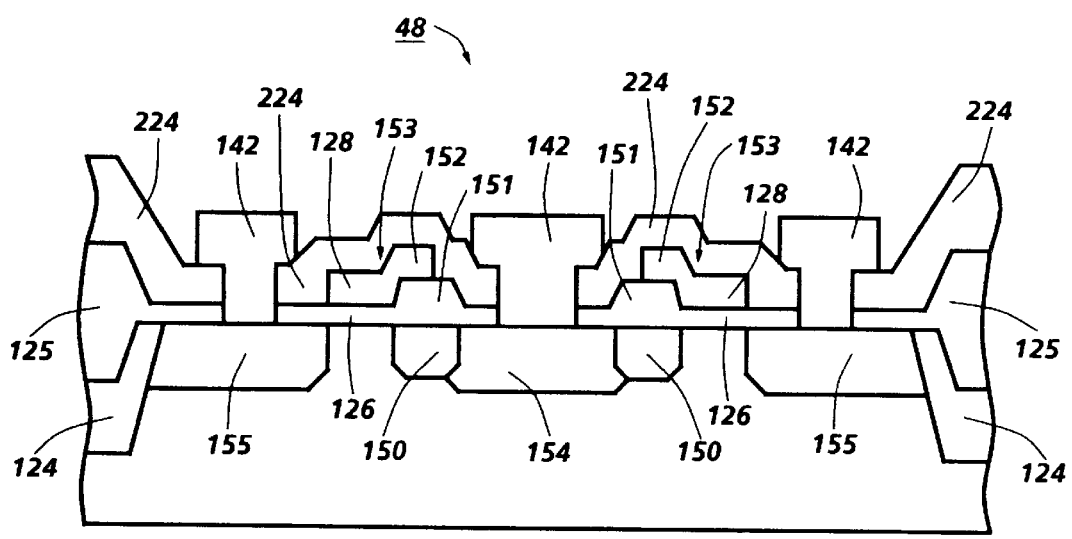
FIG. 5B is an enlarged, cross-sectional view of the MOS driver shown in FIG. 4 as viewed along view line 5b—5b.

MOS drivers 48, resistors 44 and logic circuitry 42 of FIG. 3 are proportionally represented in FIG. 4, making it readily apparent that drivers 48 consume a large surface portion of substrate 46. Constraints such as device resolution limit space available behind resistors 44. For example, as shown by distance Y, there exists approximately 84 micrometers behind each thermal resistor element 44 for the placement of a driver 48 given a printhead requiring a resolution of 300 spots per inch. Therefore, distance Y is fixed and depends on the resolution of the device, while distance X, which is approximately 1000 micrometers in this embodiment, varies depending on the desired output characteristics of driver 48, and the driver transconductance and breakdown voltage. As will be explained later, the field plated power MOS structure 48, shown in FIGS. 5A and 5B, is characterized by more uniform spacing of potential lines when the device is "off" and increased transconductance when the device is "on" as a result of higher doping of the device drift region. For example, nominal doping of a prior art drift region is about $1.5 \times 10^{12}$ ion/cm$^2$ to achieve a sheet resistance of about 5,000 $\Omega/\square$. In contrast, doping the drift layer of the driver of the present invention is sufficiently high to produce a sheet resistance of about 2,000 $\Omega/\square$, without decreasing driver breakdown voltage. Thus, a high driver transconductance provides a means to significantly shrink the integrated circuit chip 46 since most of the chip depth is consumed by power MOS drivers 48. Therefore, shortening distance X by increasing driver transconductance, reduces chip depth (direction along distance X) consumed by power MOS driver 48.

Power MOS driver 48 is further illustrated using two cross-sections as viewed along view lines 5a—5a and 5b—5b in FIG. 4, which are shown in FIGS. 5A and 5B, respectively. The two cross-sections 5A and 5B illustrate the general layout of power MOS driver 48 on substrate 46. To further minimize overall driver size, power MOS driver 48 is an elongated oval structure 153, though represented in FIG. 4 as a rectangle, with a drain region comprised of a lightly doped drift region 150 surrounding heavily doped contact region 154 (FIG. 5B). A source region 155 surrounds gate region 128. The width, or the circumference, of the elongated oval gate depends on the desired device output characteristics. FIG. 5A shows part of driver 48 and part of resistor 44 laid out on silicon wafer or substrate 146, while FIG. 5B shows a cross section of driver 48, having a drain completely enclosed by the gate. In accordance with one aspect of the invention, a single layer of polysilicon 153 forms both the gate region 128 in the outer portion and the field plate 152 in the inner portion. Drift region 150 is created under a drift oxide 151 which is adjacent the gate oxide 126. Drift region 150 is created using a photolithography and implant step that is separate from the one to create channel stop 124, which is discussed in full detail later. Above channel stop 124 is field oxide 125 with a layer of phosphorus doped glass 224 overlying the field oxide. Connections to the drain region 154, polysilicon gate and field plate layer 153, and source region 155 are made using aluminum contacts 142.

Integrated circuit on substrate 146, containing active logic, driver and resistive heater elements, is formed to some extent according to standard NMOS process steps but modified in certain important respects to form the inventive drivers. These modifications will become clear in the following discussion. This invention is an improved driver fabricated by a modification of fabrication process disclosed in U.S. Pat. No. 4,947,192 Hawkins et al. and to U.S. Pat. No. 5,075,250 Hawkins et al., the pertinent portions of which are herein incorporated by reference. The fabrication sequence for the improved driver of the present invention is shown in FIGS. 6A–6D. Basically, the driver is formed by processing a p-type silicon substrate wafer 146. NMOS logic circuits are added to the fabrication process by including depletion mode photoresist masking and implant process steps in the fabrication sequence, so that normally on and normally off devices are available to form logic devices which are shown in depletion region 114 and enhancement region 112. One layer of polysilicon 153 is used to simultaneously form resistor elements 44 in transducer region 118, gate and field plate elements for driver 48 in driver region 116, and gate elements in logic devices in logic regions 112 and 114.

Figure 6A:
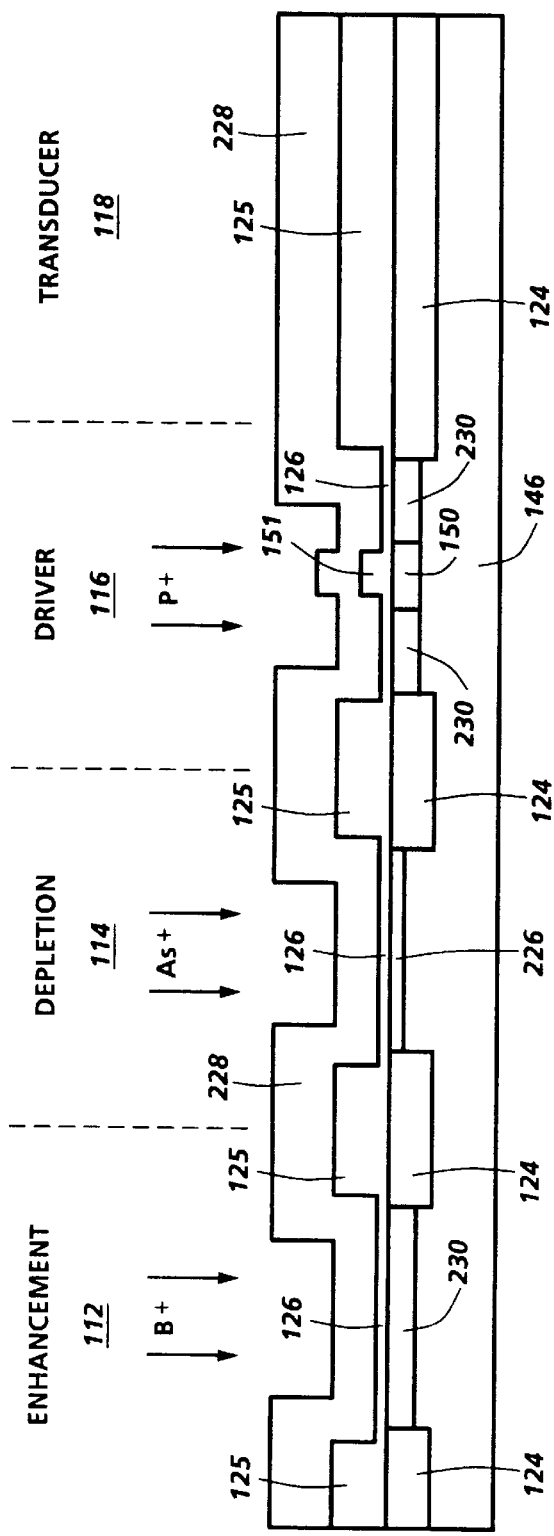
FIGS. 6A–6D are enlarged, cross-sectional views of the process steps for fabricating the integrated circuit chip of the present invention.

With reference now to FIG. 6A, silicon wafer 146 is initially passivated by thermal oxidation to form a thin or pad layer of silicon dioxide ($SiO_2$) (not shown), which is approximately 500 Å thick. A masking layer of silicon nitride ($Si_3N_4$) (not shown), approximately 1500 Å thick is formed over the pad oxide layer by pyrolytic deposition. A first photoresist layer (not shown) is then applied over the silicon nitride layer and patterned over areas 112, 114 and 116 to form active enhancement and depletion mode device areas. The areas patterned form openings or vias therein and the exposed areas of the $Si_3N_4$ layer are etched to expose the $SiO_2$ layer therebelow. Then, in combination, the first photoresist layer and the $Si_3N_3$ layer, are used to block a channel stop boron implant 124 from the active device areas; the implantation is conducted through the exposed pad oxide layer. The first photoresist layer is then removed, and the exposed pad oxide is etched to expose the silicon substrate 146 in the channel stop regions 124 implanted with boron ions. The wafers are cleaned in a series of chemical solutions, and heated to a temperature of about 1000° C. Steam is flowed past the wafer to oxidize the surface for several hours to form field oxide 125 and aligned with channel stop 124. Silicon surfaces with $Si_3N_4$ still present are not oxidized.

A second photoresist layer (not shown) is applied and patterned over the surface of the wafer to begin a step which is, accordingly, an aspect of the invention. The second photoresist layer is first used to further pattern the remaining $Si_3N_4$ layer. The $Si_3N_4$ is etched to expose $SiO_2$ over the drift area 150 in driver area 116. The second photoresist layer in combination with $Si_3N_4$ and field oxide layers are used to block a phosphorus ($P^+$) implant from device areas outside drift area 150 in driver area 116. Ion implantation of $P^+$ is then used to form self aligned $n^-$ drift region 150 in driver area 116. Subsequent to forming drift region 150, the second photoresist is removed, and the pad oxide is etched to expose silicon substrate 146 in the regions of driver area 116 implanted with $P^+$. The wafers are again cleaned in a series of chemical solutions, and heated. Steam is once again flowed past the wafer to oxidize the surface in order to form drift oxide layer 151 approximately 3500–6500 Å thick as well as to further increase field oxide layer 125 to approximately 1.5 μm thick. Subsequently, the remaining LOCOS (local oxidation of silicon) masks, which are made up of the $Si_3N_4$ layer and the $SiO_2$ pad oxide layer, are removed. Thus, as exemplified here, the field oxide thickness and drift region oxide thickness are separately optimized by forming a different oxide thickness over the drift region than over the field region. Because the channel stop and drift implants are carried out in separate lithography steps, rework of the drift layer masking is possible. Next, the wafers are cleaned, and after which 1000 Å sacrificial oxide layer (not shown) is grown on the exposed silicon surface.

A third photoresist depletion mask (not shown) is patterned on the surface of the wafer 146, and the sacrificial oxide layer in depletion area 114 is etched off. The third photoresist enables exposure of only logic depletion gate areas in depletion area 114 to an arsenic ($As^+$) depletion implant 226. Next, the depletion mask is stripped and the remaining sacrificial oxide layer is etched off. (In an alternative embodiment, the depletion masking and implantation is done before the sacrificial oxide is grown). Gate oxide layer 126 is grown over the channel areas of the active devices in enhancement, depletion and driver areas 112, 114 and 116 respectively, to preferably 920 Å in thickness. Subsequently, boron (B+) enhancement implant 230 is conducted through the gate oxide layer 126 and is blocked by field oxide 125. Except for later deposited polysilicon layer 228, wafer 146 is presently in the condition illustrated by FIG. 6A, having depletion implant 226 in depletion area 114, and enhancement implants 230 in enhancement and driver areas 112 and 116, respectively.

Figure 6B:
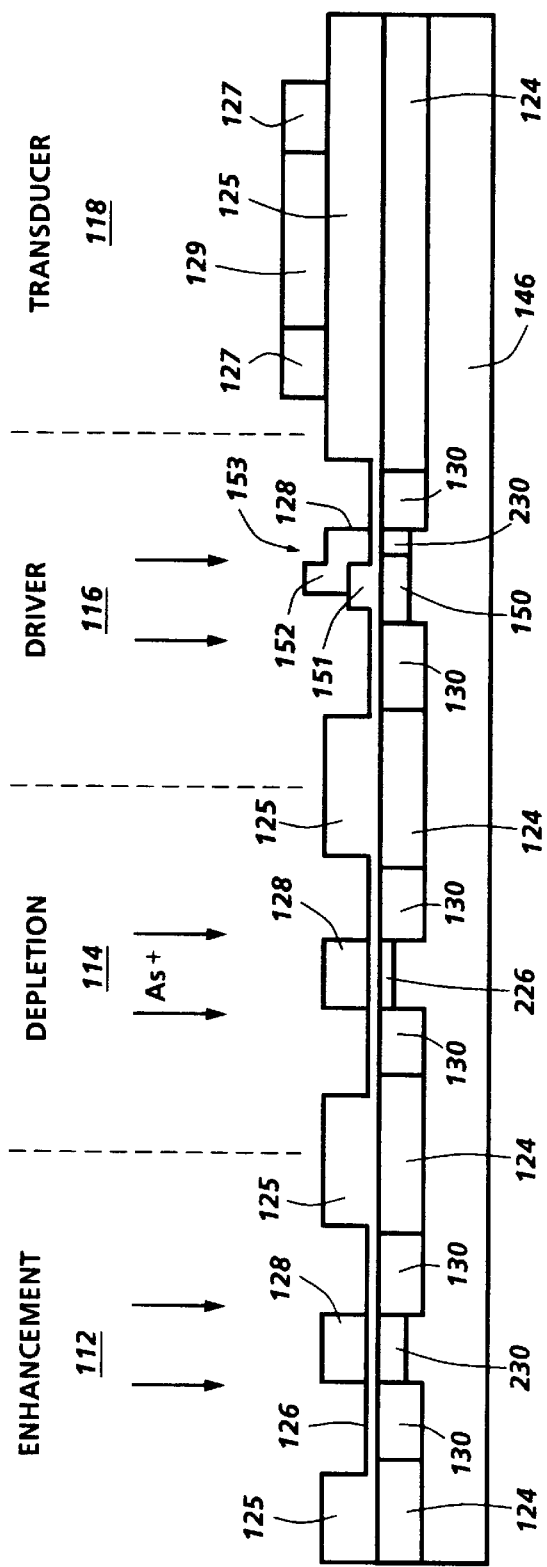
Figure 6C:
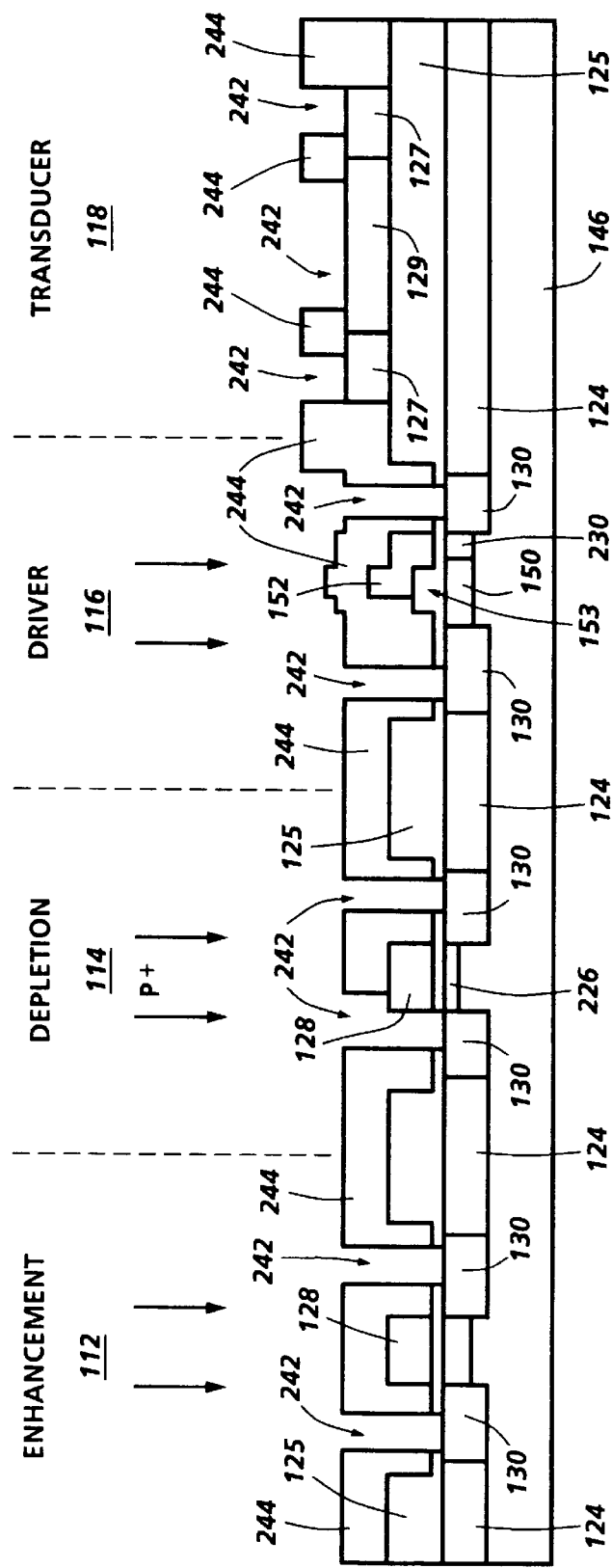

Subsequently, a single polysilicon layer 228 of preferably 4500 Å, in thickness is deposited and then implanted with phosphorous ($P^+$) ions to produce $n^+$ polysilicon with a sheet resistance of about 40 Ω/□, as shown in FIG. 6A. A fourth photoresist layer (not shown) is then applied and patterned over the surface of polysilicon layer 228 of resistive region 129 in transducer area 118. A second $n^+$ polysilicon implant of $P^+$ ions is introduced to produce a sheet resistance of 25 Ω/□ in the unmasked portions 129 of polysilicon layer 228, which will subsequently serve as heating element 44. In another aspect of the invention, the remaining photoresist is removed and a fifth photoresist layer (not shown) is deposited, patterned and etched to remove the undoped polysilicon and simultaneously form transistor gates 128, field plate 152, and resistor areas 127 and 129, as shown in FIG. 6B.

The fifth photoresist is stripped away and a sixth photoresist layer (not shown) is then deposited and patterned over the surface of transducer area 118 and over certain portions, preferably one in every six of the source regions 155 (FIGS. 5A and 5B) in driver area 116. The wafer is then exposed to an arsenic (As⁺) n⁺ implant to form source-drain contacts 130 as shown in FIG. 6B. Upon completion of the arsenic source-drain implant, the sixth photoresist layer is stripped away. A seventh photoresist (not shown) is applied, and the wafer is exposed to a boron (B⁺) p⁺ implant in source regions 130 of driver area 116 that were shielded from the arsenic source-drain implant, in order to form substrate contacts (not shown). The p⁺ substrate contacts are dispersed about the wafer surface to enable grounding through the top of wafer 146, to eliminate parasitic bipolar effects generally associated with grounding through the bottom of a wafer.

After the substrate contact implant, the seventh photoresist layer is stripped and the wafer is cleaned. Following the growth of a protective oxide layer (not shown) over the polysilicon and source-drain regions, a glass layer 244 is deposited and reflowed across the entire surface of the wafer 146. The glass is preferably a 7.5 wt. % phosphosilicate glass (PSG) that is deposited by LOTOX (low temperature oxide) deposition and reflowed in a 90 minute cycle at a temperature of about 1000° C. Subsequent to the glass reflow cycle, the wafer is again patterned with an eighth photoresist layer (not shown), to enable wet etching of the contact vias 242 shown in FIG. 6C. Wet etching is used to reduce deleterious effects to polysilicon layer 244 in the transducer region 118. After wet etching the glass and source-drain oxide layers, the eighth photoresist layer is stripped resulting in the structure illustrated in FIG. 6C, having vias 242 in glass layer 244, to provide access to the source-drain contacts and/or polysilicon regions.

Figure 6D:
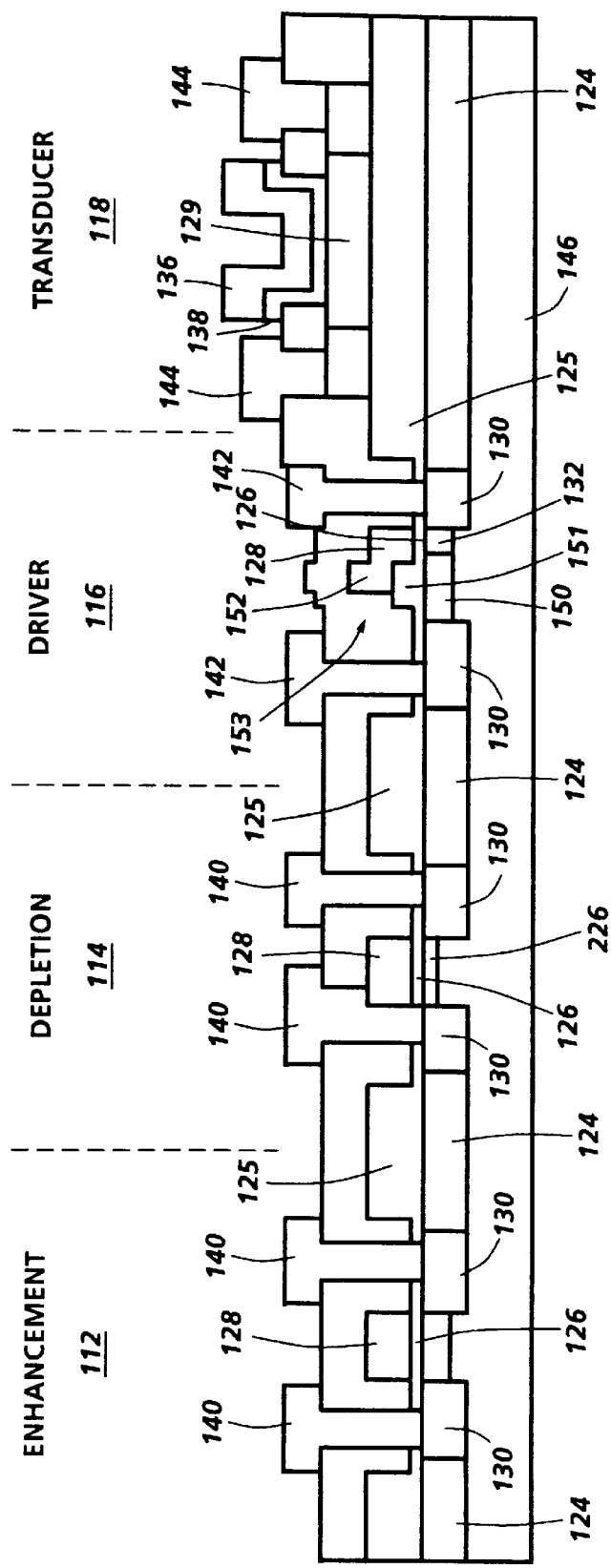

The following processing steps directed towards completion of the transducer structure, contact circuitry, and protection layers are shown in FIG. 6D, where a $Si_3N_4$ layer 138 is deposited over the wafer surface, followed by a Ta layer 136. The Tantalum layer is then patterned using a ninth photoresist layer (not shown) and etched, leaving the tantalum layer 136 only over the operative resistor region of transducer 48. Subsequently, the ninth photoresist layer is stripped and the $Si_3N_4$ layer is etched, using the Tantalum layer as a mask for the underlying $Si_3N_4$ layer 138. Following a cleaning operation, aluminum metallization is applied and patterned with a tenth photoresist layer (not shown) to form, using wet etching, interconnections 140, 142, and 144 to the logic, driver and transducer elements on the wafer, respectively. The wafer is then stripped of the tenth photoresist layer and cleaned. Protective layers of $SiO_2$, and optionally $Si_3N_4$, are deposited and subsequently patterned with an eleventh photoresist layer (not shown) prior to etching and exposing the thermal transducer 118 and integrated circuit contact pads (not shown). Subsequent to stripping the eleventh photoresist layer, a thick film polyimide layer (not shown) is deposited over all regions of the wafer and patterned to delineate the central portions of the Ta layer 136 over the transducer, thus placing them in pits 26 (shown in FIG. 2), recesses 28, and integrated circuit contact pads.

In summary, the principle advantage of using a single layer of polysilicon to form both the field plate over the drift region and a gate over the channel region independent from forming the channel stop and a field oxide is that a drift oxide can be optimized independent of the field oxide. By making the drift oxide thinner, more potential drop occurs in the silicon allowing the field plate to exert more influence on the drift region. Consequently, a less resistive drift region can be depleted of carriers in order to increase driver transconductance without an attendant decrease in breakdown voltage. The thinner drift oxide also enables the surface of the wafer to remain highly planar so that accurate photolithography is achieved. Also, since the temperature and time cycle for drift oxide growth is comparable to subsequent thermal cycles, because of its thinner disposition, the drift oxide layer diffuses laterally in subsequent thermal cycles thereby enabling a lower resistance connection to adjacent n⁺ diffused areas. Bias applied to the field plate from the gate electrode accumulates carriers in the drift region thereby decreasing drift region sheet resistance. This carrier accumulation could cause device breakdown if a substantial capacitive load is being switched since the voltage is across the driver while the drift region is accumulated with carriers. However, since the device load is very close to being completely resistive, drift region carrier accumulation is desirable because driver transconductance is substantially enhanced.

Many modifications and variations are apparent from the foregoing description of the invention, and all such modifications and variations are intended to be within the scope of the present invention.

We claim:

1. A thermal inkjet printhead comprising:
   a silicon substrate having a surface;
   a plurality of MOS transistors, each of said plurality of MOS transistors located adjacently to another of said MOS transistors, each of said MOS transistors comprising,
      a) a drain region comprising a contact region formed in said substrate adjacent said surface and a drift region formed in said substrate adjacent to said contact region, said drift region being lateral to and in substantially non-subtending relation with said contact region;
      b) a source region substantially surrounding said drain region, said source region formed in said substrate adjacent to said surface, said source region defining with said drift region a channel region with the channel region being located between said source region and said drift region;
      c) an insulative layer present on said surface of said substrate, said drift region and the channel region subtending said insulative layer, a first portion of said insulative layer, subtended by said drift region, having a thickness greater than a second portion of said insulative layer, subtended by the channel region;
      d) a single polysilicon layer having a predetermined thickness and resistivity present on said insulative layer, said single polysilicon layer including a polysilicon field plate portion subtended by said first portion of said insulative layer, serving as a field plate, and a gate portion subtended by said second portion of said insulative layer, serving as a gate, whereby said polysilicon field plate portion provides for increased transconductance of said transistor without reducing breakdown voltage to minimize the spacing between said source region and said drain region;
      e) a drain contact contacting said contact region; and
      f) a source contact contacting said source region, said source contact spaced from said drain contact, extending laterally towards said drain contact no further than said polysilicon field plate portion;
   a plurality of heater elements, each of said heater elements connected to one of said plurality of MOS transistors; and
   a plurality of orifices for expelling ink droplets, each of said orifices operatively associated with one of said plurality of heater elements.

2. The thermal ink jet printhead of claim 1, wherein said drain region is a two-piece region consisting of said contact region and said drift region.

3. The thermal ink jet printhead of claim of claim 2, wherein said source region of each of said MOS transistors is common with said source region of said adjacent MOS transistor.

4. The thermal ink jet printhead of claim 3, wherein the drift region is doped sufficiently to provide a sheet resistance of 2000 $\Omega/\square$.

5. The thermal ink jet printhead of claim 4, wherein the predetermined thickness of the insulative layer over the drift region is 3500–6500 Å, and the thickness of the insulative layer over the channel is about 920 Å.

6. The thermal ink jet printhead of claim 5, wherein the polysilicon layer has a thickness of about 4500 Å, and wherein the polysilicon layer is doped sufficiently to provide a sheet resistance of about 25 $\Omega/\square$.

7. The thermal ink jet printhead of claim 1, wherein each MOS transistor of said plurality of MOS transistors is laterally spaced from said adjacent MOS transistor a distance necessary to achieve a resolution of at least 300 spots per inch.

8. The thermal ink jet printhead of claim 1, wherein said insulative layer comprises a third portion having a thickness greater than said first portion of said insulative layer, each of said heater elements subtended by said third portion.

* * * * *